(12) United States Patent
Schultz et al.

(10) Patent No.: US 6,781,151 B2
(45) Date of Patent: Aug. 24, 2004

(54) FAILURE ANALYSIS VEHICLE

(75) Inventors: Richard Schultz, Fort Collins, CO (US); Steve Howard, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 97 days.

(21) Appl. No.: 10/307,018

(22) Filed: Nov. 27, 2002

(65) Prior Publication Data

US 2004/0102915 A1 May 27, 2004

(51) Int. Cl.[7] .................... H01L 23/58; H01L 29/73; H01L 29/74
(52) U.S. Cl. .................... 257/48; 257/207; 257/211
(58) Field of Search ................ 257/48, 207, 211

(56) References Cited

U.S. PATENT DOCUMENTS 6,483,176 B2 * 11/2002 Noguchi et al. ............ 257/666
6,707,064 B2 * 3/2004 Jang et al. .................. 257/48

* cited by examiner

*Primary Examiner*—Ngân V. Ngô
(74) *Attorney, Agent, or Firm*—The Law Offices of William W. Cochran, LLC

(57) ABSTRACT

A test vehicle for evaluating a manufacturing process for integrated circuits comprises a staircase of vias and traces arranged for maximum test coverage. The staircase may be combined with several functional cells to produce circuits that exercise many interconnections that may be designed at the minimum design parameters of manufacturing process. The accessibility of many testing methods allows an engineer to quickly find root cause failures and thus make improvements to the manufacturing process.

21 Claims, 6 Drawing Sheets

300 SCHEMATIC DIAGRAM OF A UNIT DELAY CELL

FAILURE ANALYSIS VEHICLE

BACKGROUND OF THE INVENTION a. Field of the Invention

The present invention pertains to integrated circuit manufacturing and specifically to test samples used to qualify a new manufacturing process.

b. Description of the Background

In the development of a new manufacturing process for integrated circuits, certain design rules are created that define the capabilities of the process. A designer begins the design of new integrated circuits at the same time as the manufacturing capability is being developed. The concurrency of new process development and product design places great importance on the ability of the manufacturing process to be able to produce integrated circuits using those design rules.

The design rules include such things as minimum trace width, minimum distance between traces, the maximum number of vias that may be stacked on top of each other, and other such parameters. Typically, a manufacturer may guarantee that a process will manufacture good parts if the parts conform to the design rules, thus allowing the designers to begin integrated circuit designs many months before the manufacturing process is ready.

After the first production of a new integrated circuit design, there is generally a period of failure analysis as the design and manufacturing processes are adjusted to produce a successful product. The root cause failure analysis of some integrated circuits may be very time consuming, sometimes consuming days or even weeks to isolate a single fault on a single chip.

The failure analysis techniques available to development engineers include mechanical probing, optical beam induced current (OBIC), optical beam induced resistive change (OBIRCH), picosecond imaging circuit analysis (PICA), light induced voltage alterations (LIVA), charge induced voltage alterations (CIVA), various scanning electron microscopy techniques, and other techniques known in the art. In addition, destructive tests, such as etching and lapping, may be used to isolate and identify problems.

In many cases, the design of an integrated circuit may limit or prohibit certain techniques for ascertaining faults. For example, in order to probe a certain path using a laser technique, the path must not have another metal trace directly above the path of interest. Further, the various techniques may only isolate a problem within a certain section of the circuitry, but not to a specific trace or via.

During process development and verification, it is important that faults are isolated to the exact location. For example, a via may have very high resistivity. In order for the manufacturing process to be corrected, the location of the via must be identified exactly. Failure analysis techniques that isolate only a section of a electric path is not sufficient for the fine tuning of the manufacturing process.

It would therefore be advantageous to provide a system and method for testing an integrated circuit manufacturing process wherein a multitude of failure analysis techniques may be used to quickly isolate a manufacturing defect. It would further be advantageous if the system and method were able to stress the manufacturing process by operating at the design limits of the manufacturing process.

SUMMARY OF THE INVENTION

The present invention overcomes the disadvantages and limitations of the prior art by providing a system and method for exercising an integrated circuit manufacturing process while allowing failure analysis access to as many individual connections and components as possible. Further, the present invention may be used to test static performance using direct current as well as dynamic performance with high-speed operational frequencies. An integrated circuit designed at many of the manufacturing process limits offers complete and fast failure analysis so that manufacturing defects can be quickly found and the process improved.

The present invention may therefore comprise an integrated circuit testable serpentine staircase for an integrated circuit comprising a plurality of interconnect layers, the staircase comprising: a first power bus having a first axis; a second power bus parallel to the first axis; an input signal trace on a first layer disposed between the first power bus and the second power bus; a series of successive layers wherein each layer comprises an elongate first bus power trace extending substantially perpendicular from the first axis and electrically connected to the first power bus, an elongate second bus power trace extending substantially perpendicular from the first axis and electrically connected to the second power bus, and a signal trace disposed between the first power trace and the second power trace at a predetermined distance from the first power trace to the signal trace and at the predetermined distance from the second power trace to the signal trace, wherein the signal trace from one layer is connected to the signal trace of the next layer by a via, wherein the via does not have any other traces above the via, wherein at least a portion of the signal traces has no other traces above the signal trace, the signal traces adapted to be electrically connected to the input signal trace on the first layer, the signal traces further adapted to be electrically connected to each of the layers in succession from the first layer to an upper layer; and a plurality of test pads located on the top layer adaptable to probing wherein each of the test pads is electrically connected to the signal traces on each of the layers.

The present invention may further comprise a test vehicle for an integrated circuit comprising: an input signal wire; an output signal wire; and a plurality of unit delay cells comprising a unit cell input, a unit cell output, and a plurality of integrated circuit functional cells, each of the functional cells being connected by a staircase to the next of the functional cells, the staircase comprising a first power bus having a first axis, a second power bus parallel to the first axis, an input signal trace on a first layer disposed between the first power bus and the second power bus, a series of successive layers wherein each layer comprises an elongate first bus power trace extending substantially perpendicular from the first axis and electrically connected to the first power bus, an elongate second bus power trace extending substantially perpendicular from the first axis and electrically connected to the second power bus, and a signal trace disposed between the first power trace and the second power trace at a predetermined distance from the first power trace to the signal trace and at the predetermined distance from the second power trace to the signal trace, wherein the signal trace from one layer is connected to the signal trace of the next layer by a via, wherein the via does not have any other traces above the via, wherein at least a portion of the signal traces has no other traces above the signal trace, the signal traces adapted to be electrically connected to the input signal trace on the first layer, the signal traces further adapted to be electrically connected to each of the layers in succession from the first layer to an upper layer, and a plurality of test pads located on the top layer adaptable to probing wherein each of the test pads is electrically connected to the signal traces on each of the layers.

The present invention may further comprise a method of testing a manufacturing process comprising: designing a test vehicle, the test vehicle comprising an input signal wire, an output signal wire, and a plurality of unit delay cells comprising a unit cell input, a unit cell output, and a plurality of integrated circuit functional cells, each of the functional cells being connected by a staircase to the next of the functional cells, the staircase comprising a first power bus having a first axis, a second power bus parallel to the first axis, an input signal trace on a first layer disposed between the first power bus and the second power bus, a series of successive layers wherein each layer comprises an elongate first bus power trace extending substantially perpendicular from the first axis and electrically connected to the first power bus, an elongate second bus power trace extending substantially perpendicular from the first axis and electrically connected to the second power bus, and a signal trace disposed between the first power trace and the second power trace at a predetermined distance from the first power trace to the signal trace and at the predetermined distance from the second power trace to the signal trace, wherein the signal trace from one layer is connected to the signal trace of the next layer by a via, wherein the via does not have any other traces above the via, wherein at least a portion of the signal traces has no other traces above the signal trace, the signal traces adapted to be electrically connected to the input signal trace on the first layer, the signal traces further adapted to be electrically connected to each of the layers in succession from the first layer to an upper layer, and a plurality of test pads located on the top layer adaptable to probing wherein each of the test pads is electrically connected to the signal traces on each of the layers; manufacturing the test vehicle using the manufacturing process; applying a signal to the input signal wire; reading a signal from the output signal wire; determining if the test vehicle is performing correctly; if the test vehicle is not performing correctly, determining where a failure occurred on the test vehicle; and changing the manufacturing process.

The advantages of the present invention are that an integrated circuit may be manufactured that stresses many of the design limits of the manufacturing process. Further, the full and unfettered test access to many of the signal traces allows an engineer or technician to very quickly pinpoint the exact root cause failure and thereby quickly ascertain any improvements or changes that need to be made to the manufacturing process. Further, a manufacturing process may be monitored and verified by periodically manufacturing and testing the test vehicle.

DETAILED DESCRIPTION OF THE INVENTION

Figure 1:
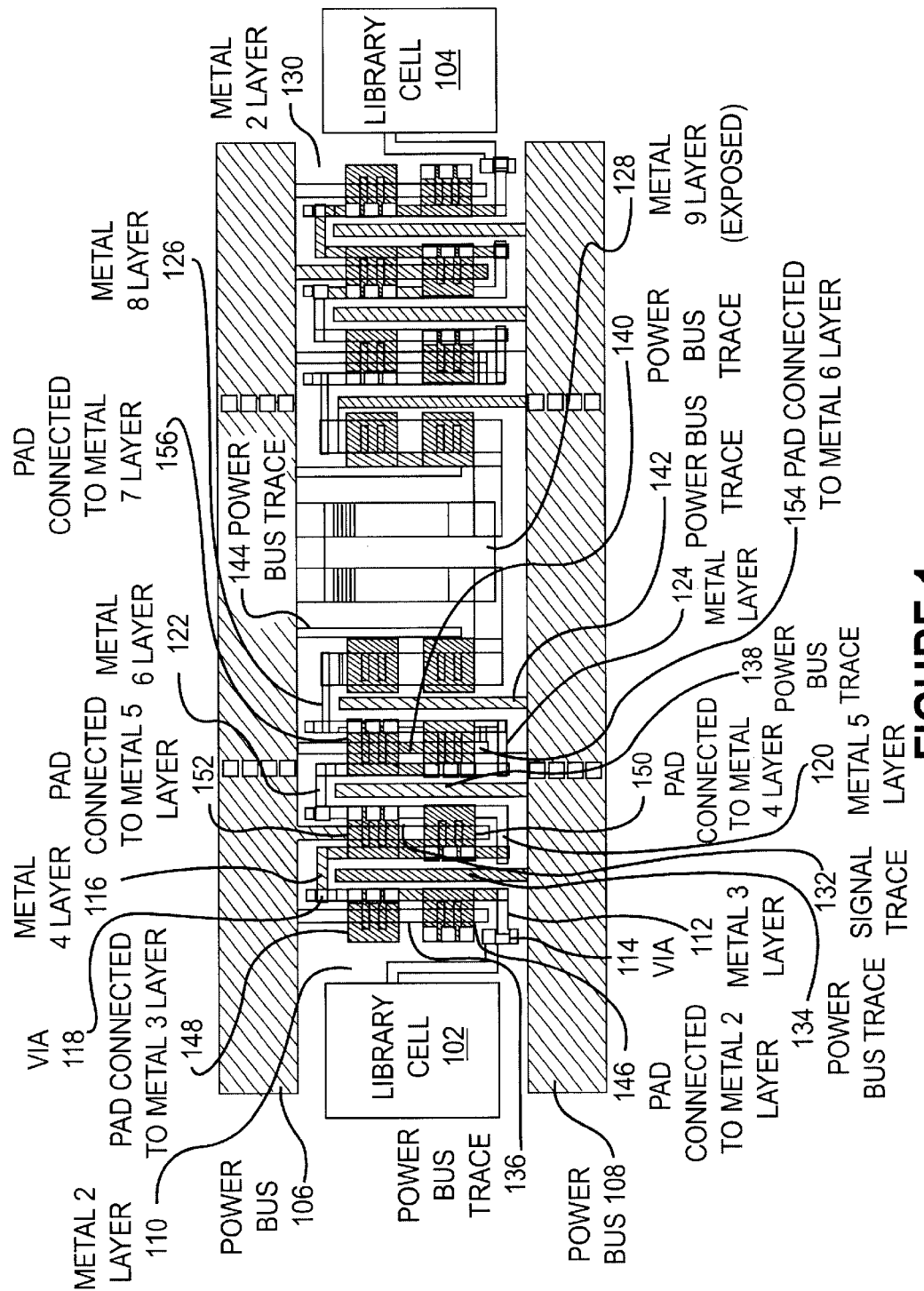
FIG. 1 is an illustration of an embodiment of the present invention of a staircase interconnect between two library cells of an integrated circuit.

FIG. 1 illustrates an embodiment 100 of a staircase interconnect between two library cells 102 and 104 of an integrated circuit. Two power busses 106 and 108 supply power to the cells 102 and 104. The signal trace leaving cell 102 begins on the metal 2 layer 110 and transfers to the metal 3 layer 112 with the via 114. The signal trace then transfers to the metal 4 layer 116 with the via 18. The signal trace continues to metal 5 layer 120, metal 6 layer 122, metal 7 layer 124, and metal 8 layer 126 in a serpentine fashion. The signal trace continues to metal 9 layer 128. The serpentine pattern is repeated in a similar fashion from metal 9 layer 128 to metal 2 layer 130 and into the second library cell 104.

Within each serpentine pattern, a trace from a power bus is placed in close proximity. For example, on the metal 4 layer 116, the signal trace 132 is in close proximity to the trace 134 that is connected to power bus 108. In a similar fashion, power bus traces 136, 138, 140, 142, and 144 are interleaved within the staircase. In addition, a trace from one of the power buses may be placed directly below the signal trace in some embodiments. The traces may be placed as close to each other as allowable by the manufacturing process parameters. The signal trace may be exposed to the top of the integrated circuit and thereby probed using various failure analysis techniques. In some embodiments, a power trace may be placed directly underneath the signal trace.

In many cases, each layer of an integrated circuit must contain a certain minimum amount of metal to minimize the stress induced in the integrated circuit die. Such conditions may be satisfied using the present design by those skilled in the art. In some cases, additional traces within each layer may have to be constructed to meet the minimum metal requirements. In other embodiments, the minimum may be satisfied with the basic staircase design.

Exposed test pads residing on the metal 9 layer are connected to the signal traces at each metal layer. Thus, pad 146 is connected to metal 2 layer 110, pad 148 to metal 3 layer 112, pad 150 to metal 4 layer 116, pad 152 to metal 5 layer 120, pad 154 to metal 6 layer 122, and pad 156 to metal 7 layer 124. Pads may also be provided on the descending portion of the staircase.

The staircase interconnect 100 is an integrated circuit design that can be used to stress a manufacturing process. All of the signal trace widths may be at the minimum size as well as the spacing between widths. Further, there are a large number of vias within the signal path between two library cells 102 and 104. Vias are a high failure rate in a typical manufacturing process for integrated circuits and are thus present to stress the manufacturing process.

The staircase interconnect 100 is designed for testability and for fault isolation. Each signal trace on each level has a corresponding test pad accessible from the metal 9 layer. This allows many test techniques to be used to identify and isolate a single broken via. In order to determine the exact root cause for a failure, it is desirable to locate the exact via or trace where a failure occurred. For example, if a via fails at metal 5 layer, the masks, dies, or other processing equipment may be examined for that specific layer. If the fault were not isolated to a specific layer and the specific via within that layer, the manufacturing process cannot be as thoroughly checked and thus process development will proceed at a slower pace.

The embodiment allows a process development engineer to produce a hard-to-manufacture design while giving the engineer as many mechanisms for evaluating failures as possible. By manufacturing an integrated circuit with a multitude of staircase interconnects 100, a test sample may be produced at the limits of the manufacturing processes but is also quickly evaluated to pin point any failures using as many failure analysis techniques as needed.

Those skilled in the art may design a staircase interconnect with various number of metal layers and with various minimum path widths or spacing between signal paths while keeping within the spirit and intent of the present invention.

Figure 2:
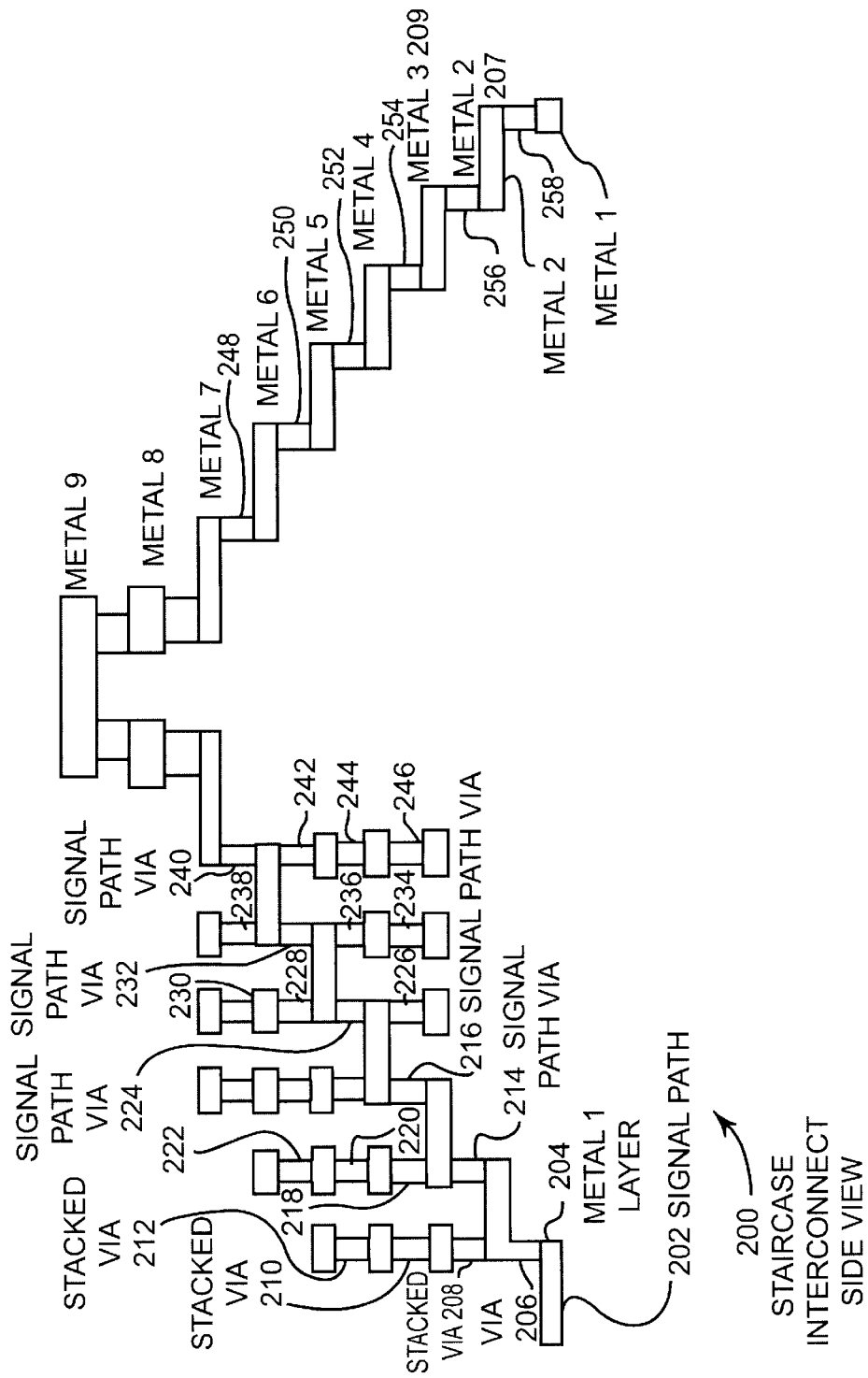
FIG. 2 is an illustration of an embodiment of the present invention of a schematic representation of the elevation of the staircase interconnect wherein stacked and non-stacked vias are used.

FIG. 2 illustrates a schematic representation of the elevation of the staircase interconnect 200 wherein stacked and non-stacked vias are used. The signal path 202 enters the staircase from a logic cell on metal 1 layer 204. The via 206 transfers the signal to metal 2 layer 207. The via 206 has three stacked vias 208, 210, and 212 immediately above via 206. The signal path again transfers to metal 3 layer 209 at via 214. Again, three stacked vias 218, 220, and 222 are placed directly above via 214. Via 224 has one via 226 below and two vias 228 and 230 above. Via 232 has vias 234 and 236 below and via 238 above via 232. Vias 242, 244, and 246 are below via 240. Vias 248, 250, 252, 254, 256, and 258 have no stacked vias.

The staircase interconnect 200 tests many possible via geometries within a single staircase. In the downward portion of the staircase, i.e., the vias 248, 250, 252, 254, 256, and 258, no stacked vias are present for independent vias between each layer present in the integrated circuit. In the upward portion of the staircase, the signal transfer via is contained within each combination of stacked vias. In some embodiments, stacked vias may be present on both portions of the staircase. Such embodiments may be useful for evaluating a manufacturing process where stacked vias are an especially serious problem and the manufacturing parameters for the process are to be evaluated.

Many integrated circuit manufacturing processes have limitations on the number stacked vias. The limitation may be due in part to the stress imparted in the integrated circuit due to the stacked vias. In the present embodiment of a staircase interconnect 200, the maximum number of stacked vias may be four. Thus, every combination or placement of stacked vias may be implemented. Those skilled in the art may be able to design staircase interconnects wherein the maximum number of stacked vias ranges from zero to the total number of metal layers within the integrated circuit. In some embodiments, the stacked vias may not be implemented in the staircase.

The number of layers in the integrated circuit may be different for various embodiments. For each layer of the integrated circuit, dies and masks must be manufactured, adding to the cost. Thus, for early manufacturing process development, an embodiment with three to five layers may be constructed to perform preliminary development, then an embodiment with the maximum number of layers possible by the process may be constructed for the final process development stages. For each integrated circuit manufacturing process, different number of maximum layers may be possible.

Figure 3:
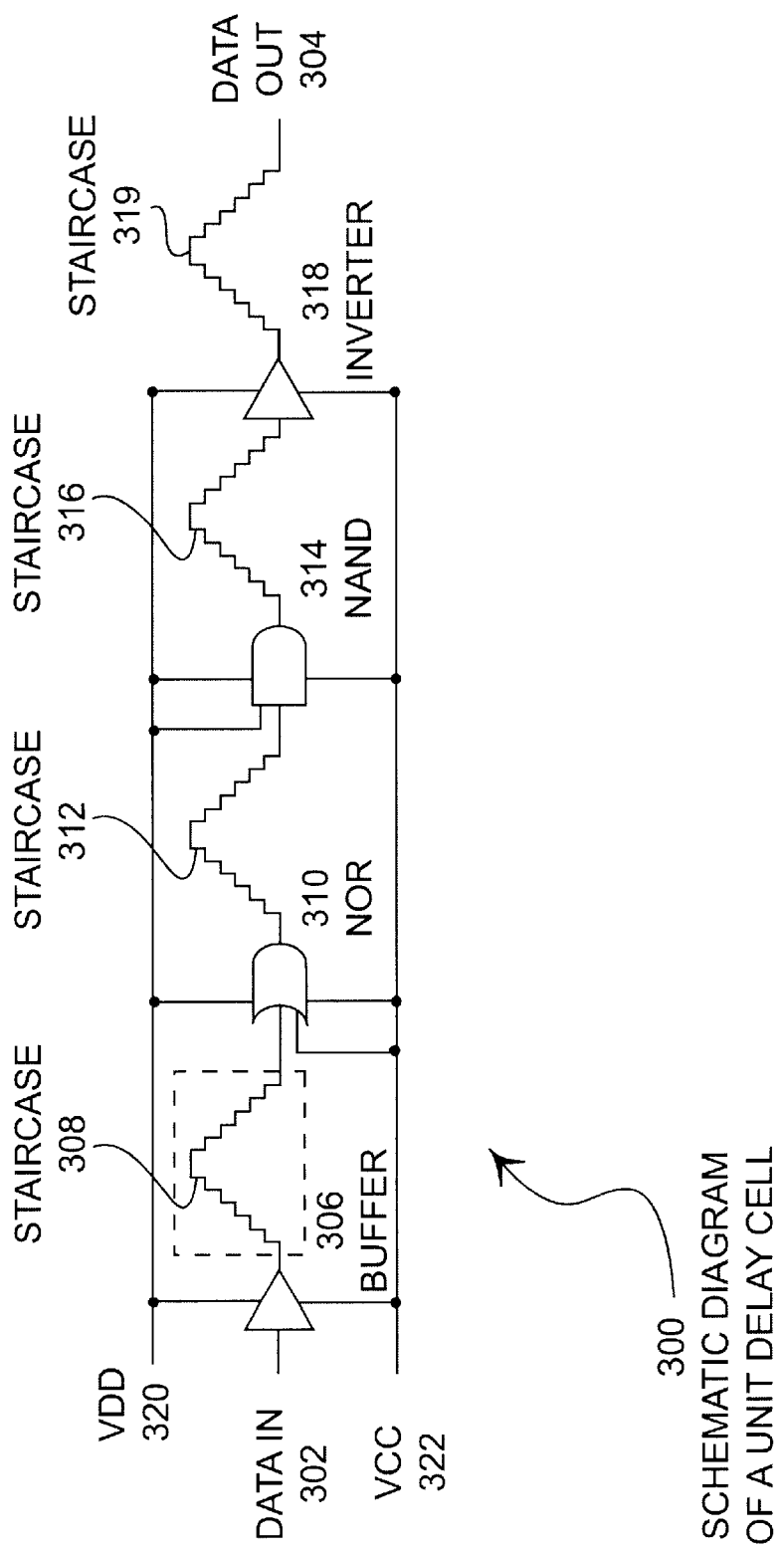
FIG. 3 is an illustration of an embodiment of the present invention of a unit delay schematic.

FIG. 3 illustrates an embodiment 300 for a unit delay schematic. The data in 302 passes through a circuit to the data out 304. The circuit comprises a buffer 306, a staircase of vias 308, a NOR gate 310, a second staircase 312, a NAND gate 314, a third staircase 316, an inverter 318, and a fourth staircase 319. The power bus comprises VDD 320 and VCC 322, which are connected to the NOR 310 and NAND 314 so that a positive signal is transmitted through the circuit. The time that is taken for the signal to propagate through the circuit can be known.

In a typical embodiment, the circuit 300 may be connected end to end many times, possibly hundreds or thousands of times in a single integrated circuit. The unit delay circuit 300 may be used in several different useful embodiments.

Figure 4:
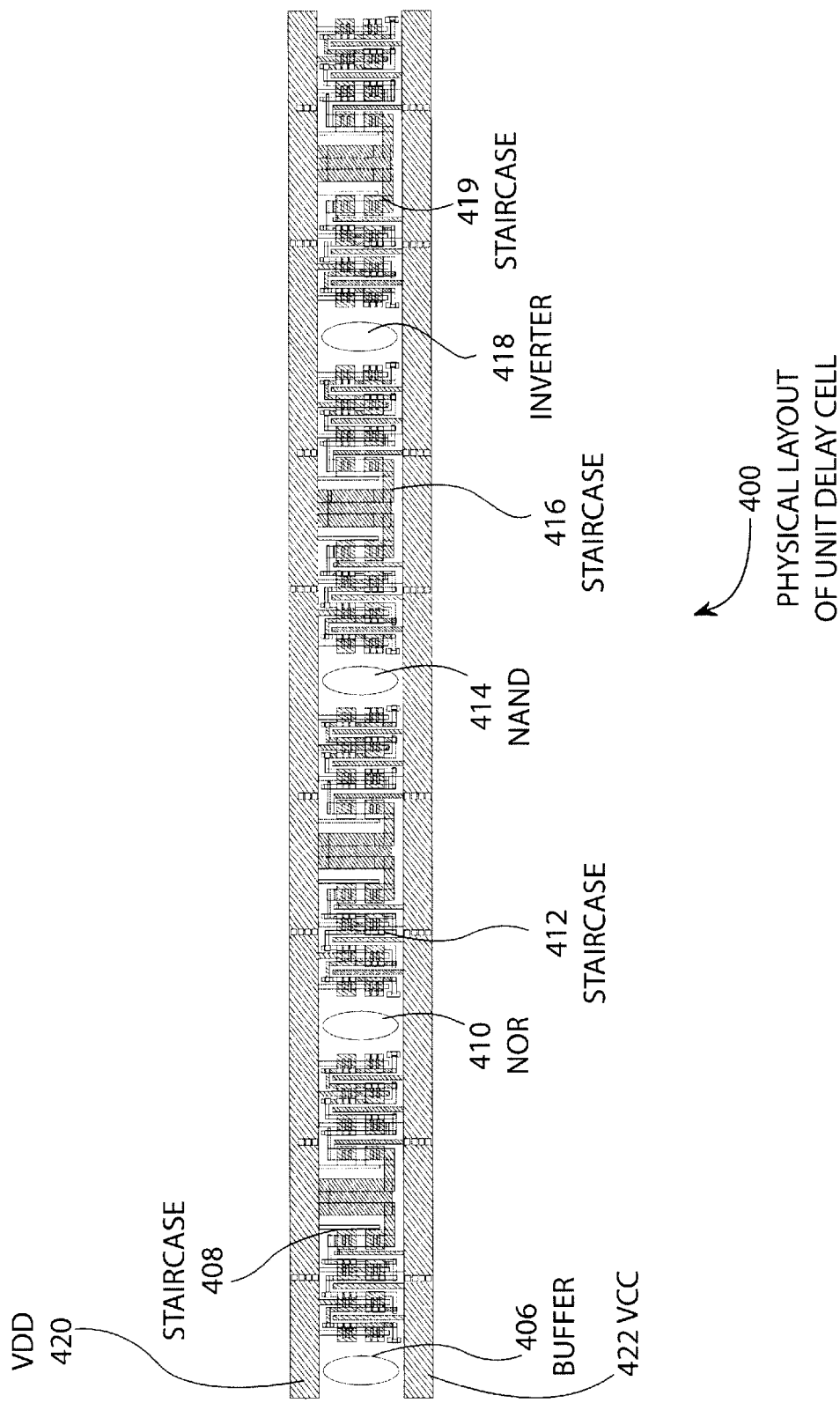
FIG. 4 is an illustration of an embodiment of the present invention of a physical layout of the unit delay cell illustrated in FIG. 3.

FIG. 4 illustrates an embodiment 400 of a physical layout of the unit delay cell illustrated in FIG. 3. The circuit comprises the buffer 406, a first staircase 408, a NOR gate 410, a second staircase 412, a NAND gate 414, a third staircase 416, an inverter 418, and a fourth staircase 419. The VDD 420 and VCC 422 power busses are also shown.

The cells may be arranged such that the power busses are aligned. This arrangement allows easy mechanical cross sectioning of the circuits to inspect problem areas. In the cross sections, known good traces may be compared to suspected bad traces because of the repeating pattern of the embodiment 400.

Figure 5:
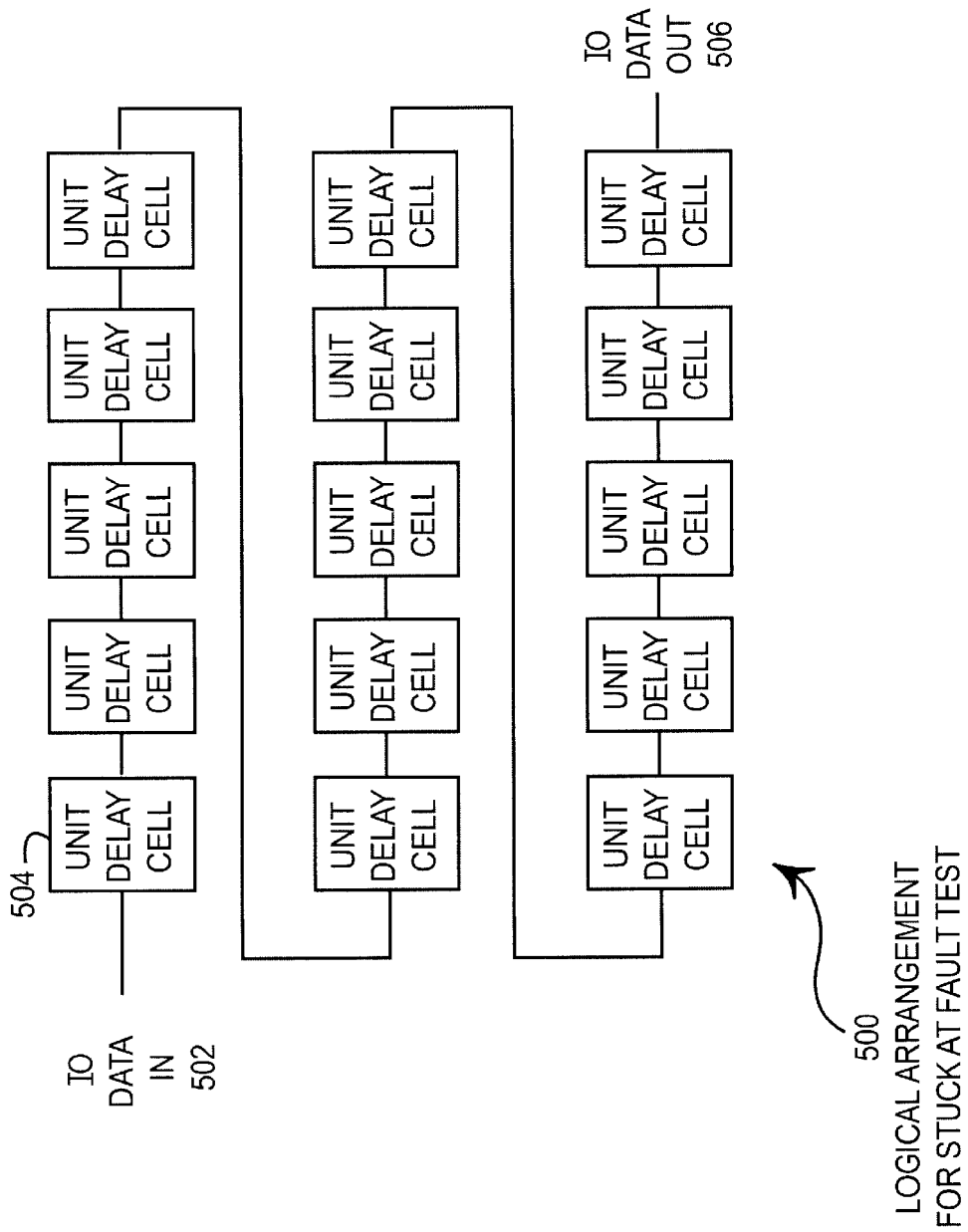
FIG. 5 is an illustration of an embodiment of the present invention of a stuck at fault test.

FIG. 5 illustrates an embodiment 500 of a stuck at fault test. A data in line 502 propagates through a series of unit delay cells 504 and exits as data out line 506. Any number of unit delay cells 504 may be used. Some embodiments may contain thousands or hundreds of thousands of unit delay cells.

When the data in line 502 is brought high, the signal propagates through each unit delay cell until a fault is reached. For example, if a single via was open or highly resistive, the signal would propagate until the faulty via were reached. Because of the test pads available in the staircase, a test engineer can simply and readily determine the exact location of the via, including the metal layer on which the via is located.

Each unit delay cell contains four staircases, each containing many vias. In a typical manufacturing process, the failure rate for vias or other integrated circuit components during process development may be in the range of 1:100,000 or higher. Thus, it may be useful to have circuits with at least 100,000 or 1,000,000 vias that are easily analyzed for failures. The manufacturing process is stressed by having to manufacture a very high number of vias or other difficult-to-manufacture features. The process can be easily tested by simply applying a voltage to the data in 502 and reading the result at data out 506.

Many different test techniques may be used to determine the location of a problem. The staircase has exposed test pads that may be mechanically probed, as well as front or back side AC laser probing, front or back side DC emission microscopy, DC Current Monitoring OBIC and OBIRCH for Resistive Defects, PICA AC Emission Acquisition, LIVA DC Fault Isolation, EBEAM AC Signal Acquisition, EBEAM Pattern Dependent DC Passive Voltage Contrast, SEM Passive Voltage Contrast, and Mechanical Probing including AC Active Pico Probing, DC Voltage Probing, and DC Active Control Probing.

The design of the unit delay cell shown in FIG. 4 can allow direct access to all of the traces within the staircase from the top, providing full coverage for the various failure analysis techniques. For example, because the signal traces are visible from the top, various laser excitement failure analysis techniques may be used to isolate problems on any portion of a signal path on any layer. In debugging other integrated circuits that are not specifically designed for testability, many portions of a signal path may be obscured by overlapping traces.

Figure 6:
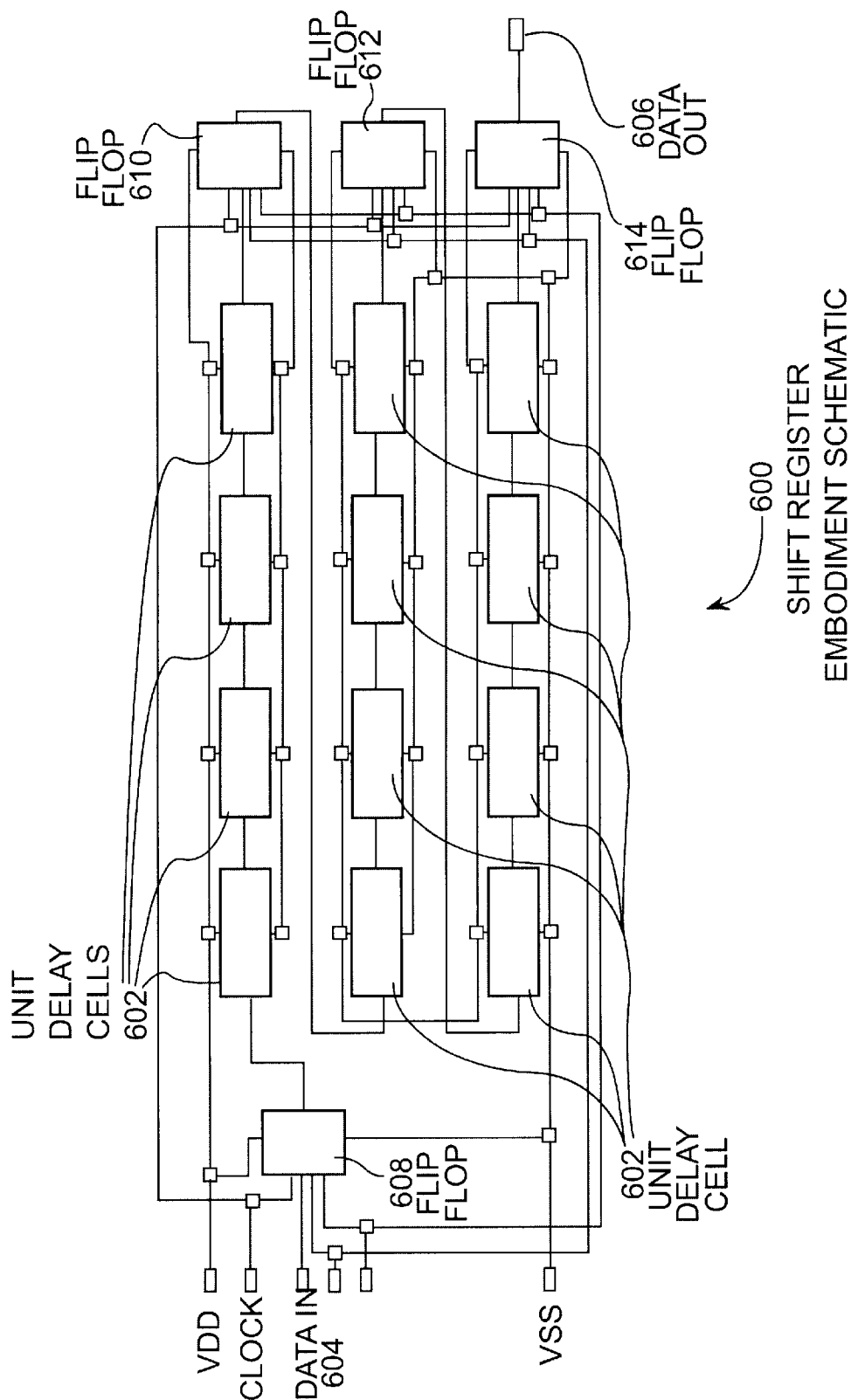
FIG. 6 is an illustration of an embodiment of the present invention of a shift register wherein the unit delay cells are configured to easily perform a high speed test.

FIG. 6 illustrates an embodiment 600 of a shift register wherein the unit delay cells 602 are configured to easily perform a high speed test. The data in 604 travels through a flip flop 608 to a string of unit delay cells 602 to a second flip flop 610. The signal travels out of the second flip flop 610 through a second string of unit delay cells 602 to a third flip flop 612. The signal travels out of the third flip flop 612, through a third string of unit delay cells 602 to a fourth flip flop 614. All of the flip flops share a common clock line.

With each clock cycle, data must simultaneously propagate through the rows of the unit delay cells 602. If a problem exists within one of the many unit delay cells, the data will not propagate properly and will become corrupted. Such problems will become more apparent when the clock speeds are high.

The present embodiment is directed at high speed testing of the integrated circuit whereas the embodiment 500 was directed at static testing of the circuitry. The present embodiment, when tested at high speeds, will detect more subtle resistive changes between elements and may be a more thorough test of the manufacturing process.

In different embodiments, the string of unit delay cells 602 may be of different lengths and the number of flip flops may also be different. For example, when many unit delay cells are used, the propagation times will be high and thus the clock speeds will be lower. Such an example may be useful when the available test equipment may not be fast enough to test shorter strings of delay cells. The number of delay cells may range from one to several hundred or more in some embodiments. Further, the number of rows of the shift register may be more or less, depending on the number of unit delay cells necessary to adequately test the manufacturing process and depending on the available die space of the integrated circuit.

In some embodiments, a shift register embodiment 600 and a stuck at fault test embodiment 500 may be present on a single integrated circuit. Other embodiments may be created by those skilled in the arts that incorporate other test circuits while maintaining within the spirit and intent of the present invention.

The various embodiments are useful for the development and verification of integrated circuit manufacturing processes. In a typical use, one of the embodiments would be designed using target design parameters for a new manufacturing process. Such design parameters may include the minimum trace width and the maximum number of stacked vias. An embodiment may be manufactured into an integrated circuit using the new manufacturing process. Any problems with the integrated circuit would be quickly isolated to the exact via or trace where the problem exists. The problems would then be traced back to the specific process, retical, or other manufacturing issue as necessary. When the process is able to produce one or more of the embodiments of the present invention without creating any faults, the process may be certified and mass production may begin.

The embodiments may be further useful for verifying existing manufacturing processes. For an established manufacturing process, it may be desirable to periodically produce one of the various embodiments to evaluate any problems with the manufacturing process and to verify proper operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit testable serpentine staircase for an integrated circuit comprising a plurality of interconnect layers, said staircase comprising:

a first power bus having a first axis;

a second power bus parallel to said first axis;

an input signal trace on a first layer disposed between said first power bus and said second power bus;

a series of successive layers wherein each layer comprises an elongate first bus power trace extending substantially perpendicular from said first axis and electrically connected to said first power bus, an elongate second bus power trace extending substantially perpendicular from said first axis and electrically connected to said second power bus, and a signal trace disposed between said first power trace and said second power trace at a predetermined distance from said first power trace to said signal trace and at said predetermined distance from said second power trace to said signal trace, wherein said signal trace from one layer is connected to the signal trace of the next layer by a via, wherein said via does not have any other traces above said via, wherein at least a portion of said signal traces has no other traces above said signal trace, said signal traces adapted to be electrically connected to said input signal trace on said first layer, said signal traces further adapted to be electrically connected to each of said layers in succession from said first layer to an upper layer; and a plurality of test pads located on the top layer adaptable to probing wherein each of said test pads is electrically connected to said signal traces on each of said layers.

2. The staircase of claim 1 wherein said signal traces are further adapted to be electrically connected to each of said layers in succession from said upper layer to said first layer.

3. The staircase of claim 1 wherein at least one of said vias comprises a plurality of stacked vias.

4. The staircase of claim 1 wherein said predetermined distance is the minimum separation distance for a specific manufacturing process.

5. The staircase of claim 1 wherein the width of said signal traces is the minimum width for a specific manufacturing process.

6. A test vehicle for an integrated circuit comprising:

an input signal wire;

an output signal wire; and a plurality of unit delay cells comprising a unit cell input, a unit cell output, and a plurality of integrated circuit functional cells, each of said functional cells being connected by a staircase to the next of said functional cells, said staircase comprising a first power bus having a first axis, a second power bus parallel to said first axis, an input signal trace on a first layer disposed between said first power bus and said second power bus, a series of successive layers wherein each layer comprises an elongate first bus power trace extending substantially perpendicular from said first axis and electrically connected to said first power bus, an elongate second bus power trace extending substantially perpendicular from said first axis and electrically connected to said second power bus, and a signal trace disposed between said first power trace and said second power trace at a predetermined distance from said first power trace to said signal trace and at said predetermined distance from said second power trace to said signal trace, wherein said signal trace from one layer is connected to the signal trace of the next layer by a via, wherein said via does not have any other traces above said via, wherein at least a portion of said signal traces has no other traces above said signal trace, said signal traces adapted to be electrically connected to said input signal trace on said first layer, said signal traces further adapted to be electrically connected to each of said layers in succession from said first layer to an upper layer, and a plurality of test pads located on the top layer adaptable to probing wherein each of said test pads is electrically connected to said signal traces on each of said layers.

7. The test vehicle of claim 6 wherein said signal traces are further adapted to be electrically connected to each of said layers in succession from said upper layer to said first layer.

8. The test vehicle of claim 7 wherein said integrated circuit functional cells comprises at least one of a list composed of a NAND gate, a NOR gate, a buffer, and an inverter.

9. The test vehicle of claim 7 wherein at least one of said vias comprises a plurality of stacked vias.

10. The test vehicle of claim 7 wherein said predetermined distance is the minimum separation distance for a specific manufacturing process.

11. The test vehicle of claim 10 wherein the width of said signal traces is the minimum width for a specific manufacturing process.

12. The test vehicle of claim 7 wherein said plurality of unit delay cells are arranged in series such that an electrical signal may pass from said input signal wire through said plurality of unit delay cells to said output signal wire.

13. The test vehicle of claim 7 further comprising:
 a plurality of flip flops arranged as a shift register wherein at least a portion of said plurality of unit delay cells are incorporated in the circuitry of said shift register.

14. A method of testing a manufacturing process comprising:
 designing a test vehicle, said test vehicle comprising an input signal wire, an output signal wire, and a plurality of unit delay cells comprising a unit cell input, a unit cell output, and a plurality of integrated circuit functional cells, each of said functional cells being connected by a staircase to the next of said functional cells, said staircase comprising a first power bus having a first axis, a second power bus parallel to said first axis, an input signal trace on a first layer disposed between said first power bus and said second power bus, a series of successive layers wherein each layer comprises an elongate first bus power trace extending substantially perpendicular from said first axis and electrically connected to said first power bus, an elongate second bus power trace extending substantially perpendicular from said first axis and electrically connected to said second power bus, and a signal trace disposed between said first power trace and said second power trace at a predetermined distance from said first power trace to said signal trace and at said predetermined distance from said second power trace to said signal trace, wherein said signal trace from one layer is connected to the signal trace of the next layer by a via, wherein said via does not have any other traces above said via, wherein at least a portion of said signal traces has no other traces above said signal trace, said signal traces adapted to be electrically connected to said input signal trace on said first layer, said signal traces further adapted to be electrically connected to each of said layers in succession from said first layer to an upper layer, and a plurality of test pads located on the top layer adaptable to probing wherein each of said test pads is electrically connected to said signal traces on each of said layers;
 manufacturing said test vehicle using said manufacturing process;
 applying a signal to said input signal wire;
 reading a signal from said output signal wire;
 determining if said test vehicle is performing correctly;
 if said test vehicle is not performing correctly, determining where a failure occurred on said test vehicle; and
 changing said manufacturing process.

15. The method of claim 14 wherein said signal traces are further adapted to be electrically connected to each of said layers in succession from said upper layer to said first layer.

16. The method of claim 14 wherein said integrated circuit functional cells comprises at least one of a list composed of a NAND gate, a NOR gate, a buffer, and an inverter.

17. The method of claim 14 wherein at least one of said vias comprises a plurality of stacked vias.

18. The method of claim 14 wherein said predetermined distance is the minimum separation distance for a specific manufacturing process.

19. The method of claim 18 wherein the width of said signal traces is the minimum width for a specific manufacturing process.

20. The method of claim 15 wherein said plurality of unit delay cells are arranged in series such that an electrical signal may pass from said input signal wire through said plurality of unit delay cells to said output signal wire.

21. The method of claim 15 wherein said test vehicle further comprises a plurality of flip flops arranged as a shift register wherein at least a portion of said plurality of unit delay cells are incorporated in the circuitry of said shift register.

* * * * *